United States Patent
Chang

(10) Patent No.: US 9,438,177 B2
(45) Date of Patent: Sep. 6, 2016

(54) PRE-DISTORTION METHOD AND ASSOCIATED APPARATUS AND NON-TRANSITORY MACHINE READABLE MEDIUM

(71) Applicant: Realtek Semiconductor Corp., HsinChu (TW)

(72) Inventor: Yuan-Shuo Chang, Taoyuan County (TW)

(73) Assignee: Realtek Semiconductor Corp., HsinChu (TW)

(*) Notice: Subject to any disclaimer, the term of this patent is extended or adjusted under 35 U.S.C. 154(b) by 0 days.

(21) Appl. No.: 14/320,552

(22) Filed: Jun. 30, 2014

(65) Prior Publication Data
US 2015/0015328 A1 Jan. 15, 2015

(30) Foreign Application Priority Data
Jul. 11, 2013 (TW) .............. 102124983 A

(51) Int. Cl.
*H03F 1/26* (2006.01)
*H03F 1/32* (2006.01)
*H03F 3/195* (2006.01)
*H03F 3/24* (2006.01)

(52) U.S. Cl.
CPC .......... *H03F 1/3258* (2013.01); *H03F 1/3247* (2013.01); *H03F 3/195* (2013.01); *H03F 3/24* (2013.01); *H03F 1/26* (2013.01); *H03F 1/3241* (2013.01); *H03F 2201/3212* (2013.01); *H03F 2201/3224* (2013.01); *H03F 2201/3227* (2013.01); *H03F 2201/3233* (2013.01)

(58) Field of Classification Search
CPC ............. H03F 2201/3224; H03F 3/24; H03F 2201/3233; H03F 1/3258; H03F 1/3241; H03F 2201/3209; H03F 3/189; H03F 2201/3227; H03F 1/32; H03F 1/26; H03F 2201/3221; H03F 27/367; H03F 1/3247; H04B 1/0475; H04B 2001/0425; H04B 1/62; H04L 27/368; H04L 27/367
USPC ........................................................ 330/149
See application file for complete search history.

(56) References Cited

U.S. PATENT DOCUMENTS

| | | | |
|---|---|---|---|
| 7,023,273 B2* | 4/2006 | Johnson et al. .............. 330/149 |
| 7,348,844 B2* | 3/2008 | Jaenecke ...................... 330/149 |
| 2010/0248658 A1 | 9/2010 | Pratt | |
| 2010/0277236 A1* | 11/2010 | Horiguchi et al. ........... 330/149 |
| 2011/0163806 A1* | 7/2011 | Hongo ........................... 330/149 |
| 2013/0005283 A1* | 1/2013 | van Zelm et al. ............. 330/149 |

* cited by examiner

Primary Examiner — Khanh V Nguyen
(74) Attorney, Agent, or Firm — Winston Hsu; Scott Margo

(57) ABSTRACT

A pre-distortion method includes: receiving an input data; and obtaining a pre-distorted output by inputting the input data into a pre-distortion function, wherein the pre-distortion function is determined according to a power amplifier. A pre-distortion apparatus includes a receiver and a pre-distortion unit. The receiver is utilized for receiving an input data. The pre-distortion unit is utilized for obtaining a pre-distorted output by inputting the input data into a pre-distortion function, wherein the pre-distortion function is determined according to a following power amplifier. A non-transitory machine readable medium stores a program code executed for performing steps of the proposed pre-distortion method.

30 Claims, 10 Drawing Sheets

PRE-DISTORTION METHOD AND ASSOCIATED APPARATUS AND NON-TRANSITORY MACHINE READABLE MEDIUM

BACKGROUND OF THE INVENTION

1. Field of the Invention

The disclosed embodiments of the present invention relate to a calibration method for a communication system and associated circuits, and a non-transitory machine readable medium, and more particularly, to a pre-distortion method for compensating a power amplifier of a radio frequency (RF) circuit having non-linear characteristics and/or memory effect, and an associated apparatus and a non-transitory machine readable medium.

2. Description of the Prior Art

Spectral efficiency has become more significant as a result of wider bandwidth requirements coupled with rapid development in the field of mobile communication. In a complex non-constant envelope modulation, circuit designers have to grasp characteristics of a power amplifier employed in an RF circuit due to the high peak-to-power ratio (PAPR). FIG. 1 is a diagram illustrating a transmitter of a conventional wireless communication system. Non-linear characteristics of a power amplifier 104 may produce amplitude modulation-amplitude modulation (AM-AM) distortion and amplitude modulation-phase modulation (AM-PM) distortion at an output terminal. The distortion will become worse as the bandwidth becomes wider, which make spectral out-of-band re-growth and in-band distortion effects occur. Eventually, the error vector magnitude (EVM) may be degraded. In addition, the output of the power amplifier 104 may be affected by past inputs, which is called the memory effect. The memory effect deteriorates as the bandwidth gets higher. As the conventional pre-distortion circuit 102 cannot handle the non-linear characteristics/memory effect of the power amplifier, it may be unable to satisfy requirements of today's wireless communication systems.

SUMMARY OF THE INVENTION

According to the disclosed embodiments of the present invention, a pre-distortion method for compensating a power amplifier of a radio frequency (RF) circuit having non-linear characteristics and/or memory effect and an associated apparatus and a non-transitory machine readable medium are disclosed to improve the aforementioned issues.

According to an exemplary embodiment of the present invention, a pre-distortion method is disclosed. The pre-distortion method comprises: receiving an input data; and obtaining a pre-distorted output by inputting the input data into a pre-distortion function, wherein the pre-distortion function is determined according to a following power amplifier.

According to another exemplary embodiment of the present invention, a pre-distortion apparatus is disclosed. The pre-distortion apparatus comprises a receiving unit and a pre-distortion unit. The receiving unit is arranged for receiving an input data. The pre-distortion unit is arranged for obtaining a pre-distorted output by inputting the input data into a pre-distortion function, wherein the pre-distortion function is determined according to a following power amplifier.

According to still another exemplary embodiment of the present invention, a non-transitory machine readable medium is disclosed. The non-transitory machine readable medium stores a program code, wherein when executed by a processor, the program code enables the processor to perform a pre-distortion method, the method comprising: receiving an input data; and obtaining a pre-distorted output by inputting the input data into a pre-distortion function, wherein the pre-distortion function is determined according to a following power amplifier.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
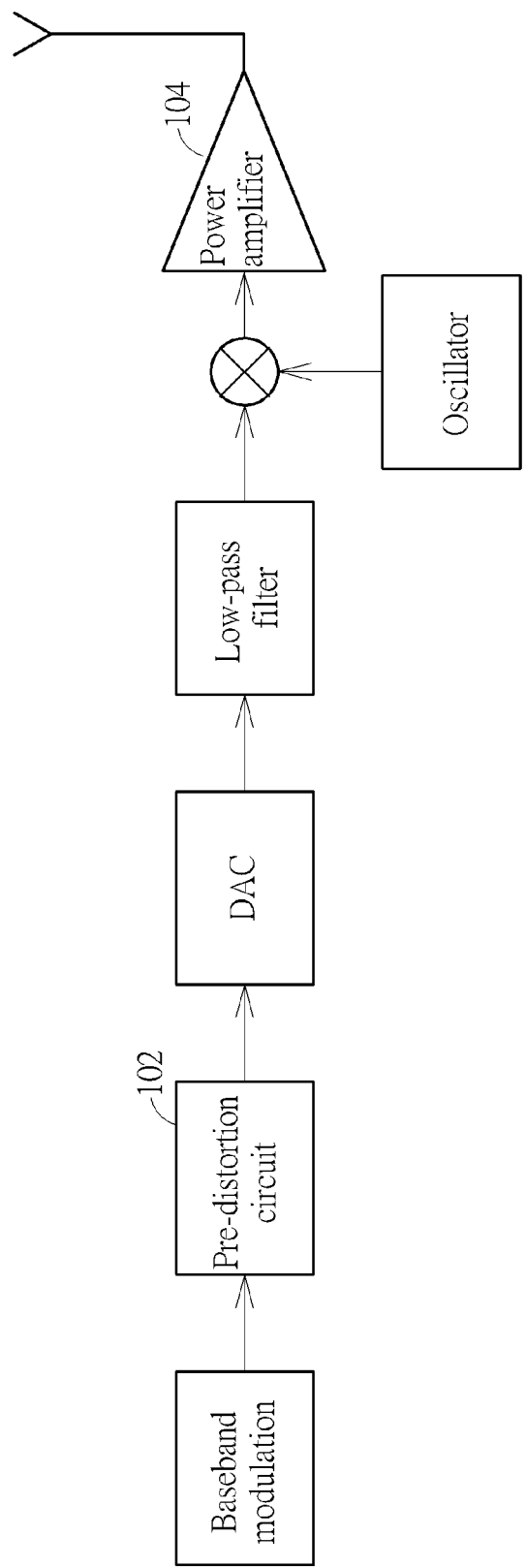
FIG. 1 is a diagram illustrating a transmitter of a conventional wireless communication system.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "coupled" is intended to mean either an indirect or direct electrical connection. Accordingly, if one device is coupled to another device, that connection may be through a direct electrical connection, or through an indirect electrical connection via other devices and connections.

The main object of the present invention is to mitigate or cancel non-linear characteristics and/or the memory effect. Unwanted characteristics are intended to be cancelled and only linear characteristics of the power amplifier are preserved in a preferred embodiment. In the architectures employed by the disclosed embodiments of the present invention, signals pass an inversed function of a non-linear function and/or memory function of a power amplifier in a radio frequency (RF) circuit before the signals are injected into the power amplifier. The non-linear characteristics and/or the memory effect can then be cancelled after the signals pass through the power amplifier For enhancing the understanding of the concept of the disclosed pre-distortion method, deduction of mathematical formulas is presented as follows. A model for a power amplifier in an RF circuit needs to be built. The characteristic function of a general power amplifier of an RF circuit can be expressed in many different ways. For example, the non-linear characteristic may be expressed in the form of a memory polynomial (MP), which is simple and easy to understand. The difference between a modeling result and a behavior in the real world is not highly significant although the memory polynomial of the non-linear characteristic is a simplified function; therefore, the error margin of the memory polynomial is acceptable. A power amplifier can be expressed by the following function in the form of a memory polynomial:

$$y(n) = \sum_{i=0}^{M} \sum_{\substack{j=0 \\ j=even}}^{p} C_{i,j}(n-i)|x(n-i)|^j \quad (1)$$

In equation (1), y(n) is a power amplifier output of the power amplifier, and x(n) is a power amplifier input of the power amplifier. Further, M denotes a memory depth of the power amplifier, and p denotes a polynomial order of the power amplifier.

Please note that, in order to not excessively degrade the accuracy according to the general behaviour of a power amplifier, only even terms of the memory polynomial can be retained, as shown in equation (1). In this way, equation (1) can be expanded and reformed based on the above assumptions.

$$y(n) = \sum_{i=0}^{M} x(n-i) \sum_{\substack{j=0 \\ j\ is\ even}}^{p} C_{i,j}|x(n-i)|^j \quad (2)$$

$$= \sum_{i=0}^{M} x(n-i)d_i$$

Where $$d_i = \sum_{\substack{j=0 \\ j\ is\ even}}^{p} C_{i,j}|x(n-i)|^j \quad (3)$$

Where $d_i$ is regarded as a time-variant coefficient; so that the power amplifier can be regarded as a time-variant filter (i.e. a filter comprises time-variant tap coefficient) according to equation (2) derived from the memory polynomial of the power amplifier. For instance, the depth of the memory polynomial of the power amplifier may be 4, and the memory depth may be 2, i.e. p=4 and M=2, which means the power amplifier output y(n) is not only influenced by the current power amplifier input x(n), but is also influenced by a power amplifier input x(n−1) of one previous time unit and a power amplifier input x(n−2) of two previous time units. When p=4 and M=2, equation (3) can be rewritten as equation (4).

$$y(n) = C_{0,0}x(n) + C_{0,2}x(n)|x(n)|^2 + C_{0,4}x(n)|x(n)|^4 + C_{1,0}x(n-1) + \quad (4)$$
$$C_{1,2}x(n-1)|x(n-1)|^2 + C_{1,4}x(n-1)|x(n-1)|^4 + C_{2,0}x(n-2) +$$
$$C_{2,2}x(n-2)|x(n-2)|^2 + C_{2,4}x(n-2)|x(n-2)|^4 =$$
$$x(n)d_0 + x(n-1)d_1 + x(n-2)d_2$$

Equation (5) shows filter tap coefficients $d_0$, $d_1$, $d_2$.

$$d_0 = C_{0,0} + C_{0,2}|x(n)|^2 + C_{0,4}|x(n)|^4$$
$$d_1 = C_{1,0} + C_{1,2}|x(n-1)|^2 + C_{1,4}|x(n-1)|^4$$
$$d_2 = C_{2,0} + C_{2,2}|x(n-2)|^2 + C_{2,4}|x(n-2)|^4 \quad (5)$$

The simplified time-variant filter derived from the power amplifier possesses coefficients $d_0$, $d_1$, $d_2$, wherein $d_0$ is a function of $|x(n)|^2$, $d_1$ is a function of $|x(n-1)|^2$, and $d_2$ is a function of $|x(n-2)|^2$. It should be noted that the size of the order of the memory polynomial of the power amplifier and the size of the memory depth mentioned above is for illustrative purposes only, and is not a limitation of the present invention. The present invention is also applicable for a power amplifier with any other size of the depth of the memory polynomial.

Figure 2:
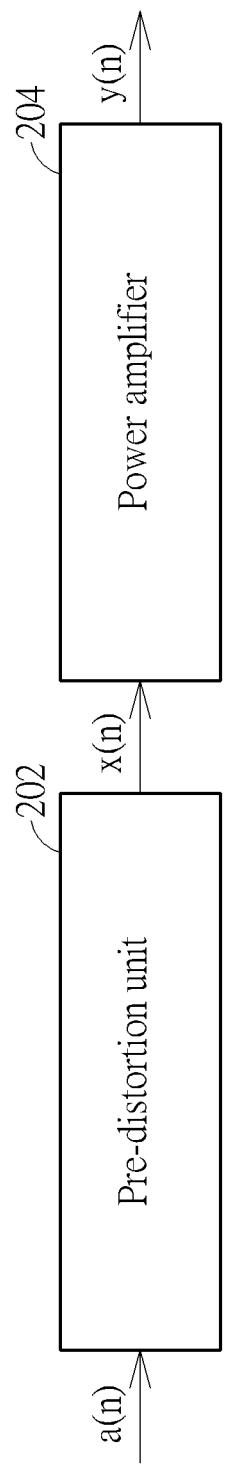
FIG. 2 is a diagram illustrating a pre-distortion model according to the present invention.

A detailed description regarding how to utilize the above equations to further obtain a desired pre-distortion function is provided in the following. This is the main purpose of the present invention. FIG. 2 is a diagram illustrating a pre-distortion model of the present invention. The pre-distortion model includes a pre-distortion unit 202 and a power amplifier 204. At time n, a(n) is a pre-distorted input of the pre-distortion unit 202, and x(n) is a pre-distorted output of the pre-distortion unit 202, i.e. an input of the power amplifier 204. y(n) is a power amplifier output of the power amplifier 204. Based on the objectives of the present invention mentioned above, it is understood that a result of y(n)=a(n) will be obtained if a characteristic function of the pre-distortion unit 202 is an inversed function of a characteristic function of the power amplifier 204, which means that the pre-distortion unit 202 perfectly offsets the imperfect non-linear characteristics of the power amplifier 204. Equation (6) can be further derived based on equation (2).

$$x(n) = \frac{1}{d_0}\left[a(n) - \sum_{i=1}^{M} x(n-i)d_i\right] \quad (6)$$

The pre-distortion unit 202 has to meet equation (6) to make the function of the pre-distortion unit 202 become the inversed function of the power amplifier 204. It is known that the coefficient $d_0$ is a function of $|x(n)|^2$ based on equation (5), i.e. $d_0$ is a function of x(n). In addition, it is also known that x(n) is a function of $d_0$, and the interlocking relationships make it difficult to derive a solution. In practice, therefore, other techniques have to be used to avoid such a dilemma.

After a rearrangement, equation (6) can be rewritten as:

$$x(n)d_0 = \left[ a(n) - \sum_{i=1}^{M} x(n-i)d_i \right] \quad (7)$$

Next, both sides of the equal sign are squared.

$$|x(n)d_0|^2 = \left| a(n) - \sum_{i=1}^{M} x(n-i)d_i \right|^2 \quad (8)$$

At time n, the pre-distortion unit 202 can obtain the pre-distorted input a (n) directly; and the pre-distorted output x(n−i) before the time n is given, wherein i=1, 2, ..., M. For example, x(n−i) can be stored in advance for further usage at the time n. As for $d_i$, the adaptive algorithm can be utilized to respectively obtain and store the corresponding $d_i$ with respect to different x(n−i). For instance, the $d_i$ may be stored in a look-up table, so that the $d_i$ can be determined according to x(n−i) at the time n. Specifically, at the time n, variables at the right side of the equal sign of equation (8) are all known and available. x(n) is not available at the time n, however, and thus it is not possible to determine the corresponding $d_0$ in a same way by using x(n). As a result, $|x(n)d_0|^2$ must be determined using equation (8), which can be complicated when dealing with $d_0$. Similarly, look-up tables need to be setup for storing $d_0$ and the corresponding $|x(n)d_0|^2$. In other words, when x(n) is not known at time n, it will not be used; instead, $|x(n)d_0|^2$ that can be calculated at time n will be used. When equation (6) is performed and $d_o$ is required, $$\left| a(n) - \sum_{i=1}^{M} x(n-i)d_i \right|^2$$

will first be calculated and then $|x(n)d_0|^2$ will be determined from the look-up which stores multiple sets of $|x(n)d_0|^2$. The $|x(n)d_0|^2$ found out from the look-up table is the one closest to the calculated $|x(n)d_0|^2$. The $d_o$ corresponding to the selected $|x(n)d_0|^2$ can therefore be eventually obtained according to the look-up table of $d_o$. The result is close but not one hundred percent accurate. The pre-distorted output x(n) of the pre-distortion unit 202 can be obtained by applying $d_o$ to equation (6). The details of building the look-up tables by using the adaptive algorithm will be described in the following paragraphs.

Figure 3:
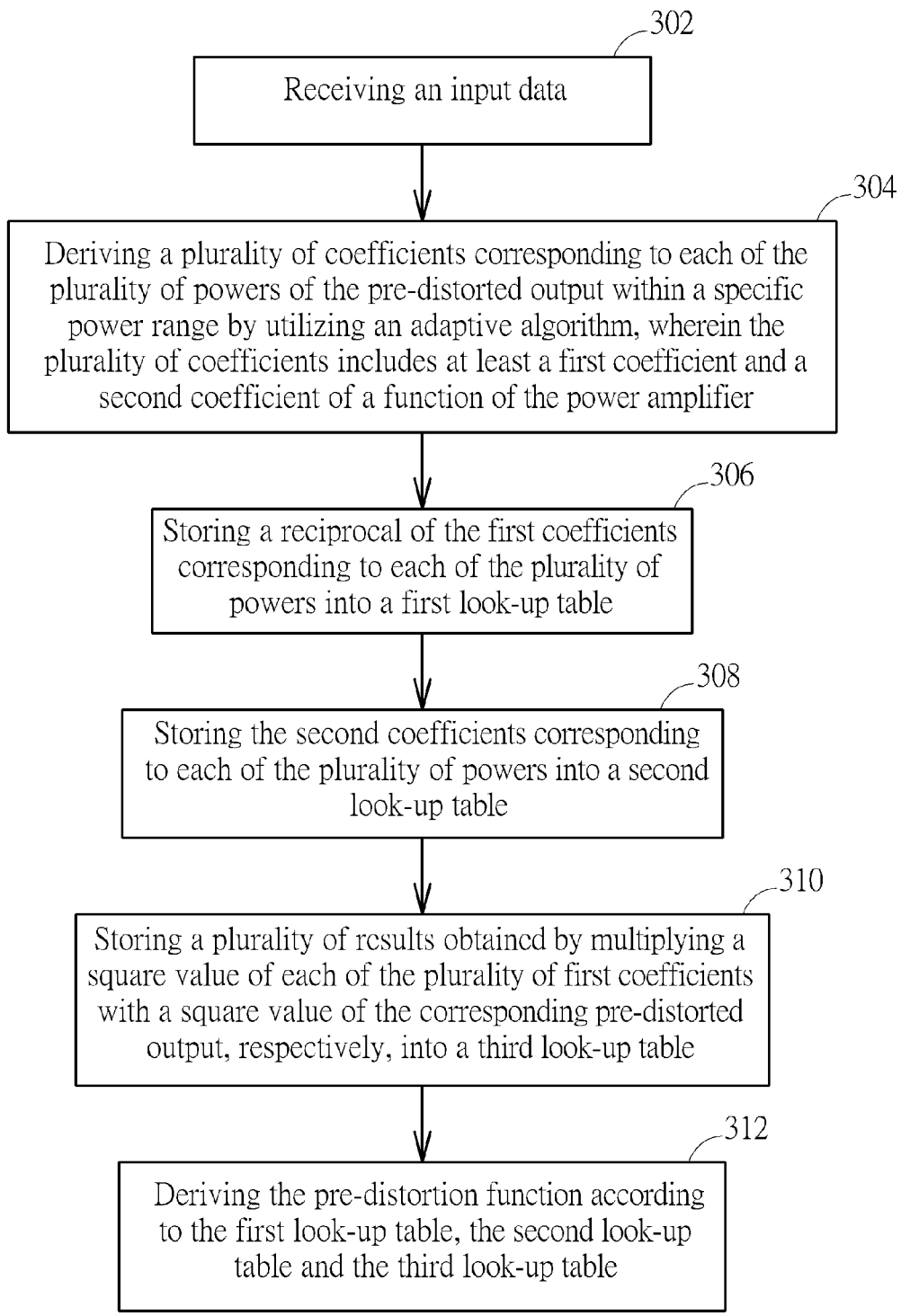
FIG. 3 is a flowchart illustrating a pre-distortion method according to an exemplary embodiment of the present invention.

FIG. 3 is a flowchart illustrating a pre-distortion method according to an exemplary embodiment of the present invention. Provided that substantially the same result is achieved, the steps in FIG. 3 need not be in the exact order shown and need not be contiguous; that is, other steps can be intermediate. Some steps in FIG. 3 may be omitted according to various embodiments or requirements. Details of the pre-distortion method are described as follows.

Step 302: receiving an input data;
Step 304: deriving a plurality of coefficients corresponding to each of the plurality of powers of the pre-distorted output within a specific power range by utilizing an adaptive algorithm, wherein the plurality of coefficients includes at least a first coefficient and a second coefficient of a function of the power amplifier;

Step 306: storing a reciprocal of the first coefficients corresponding to each of the plurality of powers into a first look-up table;
Step 308: storing the second coefficients corresponding to each of the plurality of powers into a second look-up table;
Step 310: storing a plurality of results obtained by multiplying a square value of each of the plurality of first coefficients with a square value of the corresponding pre-distorted output, respectively, into a third look-up table; and
Step 312: deriving the pre-distortion function according to the first look-up table, the second look-up table and the third look-up table.

Figure 4:
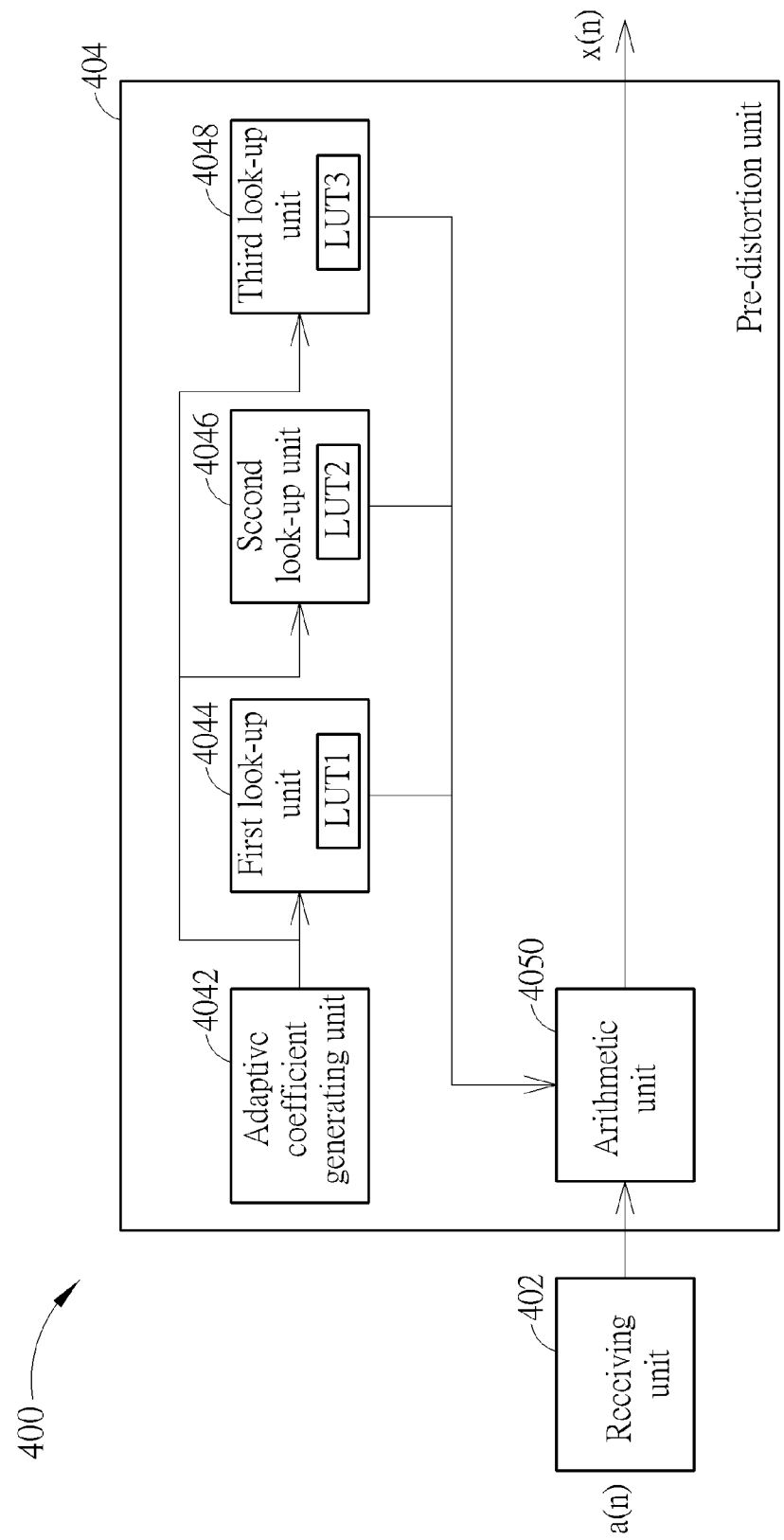
FIG. 4 is a diagram illustrating a pre-distortion apparatus according to an exemplary embodiment of the present invention.

FIG. 4 is a diagram illustrating a pre-distortion apparatus according to an exemplary embodiment of the present invention. The pre-distortion apparatus 400 includes at least one portion (e.g. a portion or all) of an electronic device, wherein the electronic device includes at least a transmission circuit and a receiving circuit. The pre-distortion apparatus 400 may comprise a portion of the electronic device mentioned above, and more particularly, can be a control circuit such as an integrated circuit (IC) within the electronic device. In another example, the pre-distortion apparatus 400 can be the entire electronic device mentioned above. Examples of the electronic device may include, but are not limited to, a mobile phone (e.g. a multifunctional mobile phone), a mobile computer (e.g. tablet computer), a personal digital assistant (PDA), and a personal computer such as a laptop computer. For example, the pre-distortion apparatus 400 may be a process module of the electronic device, such as a processor. In another example, the pre-distortion apparatus 400 may be the entire electronic device; however, this is for illustrative purposes, and not a limitation of the present invention. In practice, any alternative design can achieve the same or similar functions. According to an alternative design of the present invention, the pre-distortion apparatus 400 is a system of the electronic device, and the electronic device is a sub-system of the system. More particularly, the electronic device may include an Orthogonal Frequency Division Multiplexing (OFDM) circuit, wherein the pre-distortion apparatus 400 is able to compensate the non-linear characteristics of a power amplifier of said OFDM circuit, although this is not a limitation of the present invention.

As shown in FIG. 4, the pre-distortion apparatus 400 includes a receiving unit 402 and a pre-distortion unit 404. The receiving unit 402 is used for executing step 302, i.e. receiving an input data a(n), wherein n denotes a discrete time of a digital signal process. In this embodiment, the input data a(n) is an OFDM data produced by an OFDM process, wherein the OFDM process is widely applied in communication systems, especially in wireless communication systems. It should be noted that the present invention is not limited to wireless communication systems. The pre-distortion unit 404 includes an adaptive coefficient generating unit 4042, a first look-up unit 4044, a second look-up unit 4046, a third look-up unit 4048 and an arithmetic unit 4050. Please note that the modules mentioned in this embodiment are termed by their general purpose, and the specific implementation of each module will be given in embodiments of the following paragraphs. For simplifying the complexity of each embodiment, a depth of a memory polynomial of a target power amplifier that the pre-distortion unit 404 deals with is 2, and a memory depth is 1; in other words, for equation (1), (2) and (3), p=2 and M=1. The size of the order of the memory polynomial of the power amplifier and the size of the memory depth mentioned above is for illustrative purposes only, however.

In FIG. 4, after the receiving unit 402 transmits the input data a(n) to the pre-distortion unit 404, the input data a(n) goes through a pre-distortion function of the pre-distortion unit 404 and a pre-distorted output x(n) can be obtained. In this embodiment, the pre-distortion process is the exact content of equation (6).

In the next step, the corresponding $d_i$ for different x(n−i) can be respectively obtained and stored by the adaptive algorithm, and the corresponding $d_i$ can therefore be selected according to x(n−i) at time n. Further, by referring to equation (5), it can be seen that $d_i$ is a function of $|x(n-i)|^2$, wherein x(n−i) is actually composed of an in-phase component and a quadrature-phase component, and $|x(n-i)|^2$ can be regarded as a power of x(n−i). Before the pre-distortion unit 404 begins to process the input data a (n) (which will be disclosed in the following paragraphs), coefficients $d_0$ and $d_1$ corresponding to each of the plurality of power levels of the pre-distorted output x(n) within a specific power level range are calculated in advance by utilizing an adaptive algorithm performed by the adaptive coefficient generating unit 4042 in step 304 of this embodiment. By using the adaptive algorithm performed by the adaptive coefficient generating unit 4042, different $|x(n)|^2$ within the specific power level range and corresponding $d_o$ can be calculated in advance; and different $|x(n-1)|^2$ within the specific power level range and corresponding $d_1$ can be calculated in advance as well. The adaptive algorithm may be a least mean square (LMS) algorithm but the present invention is not limited to this; any other adaptive algorithm can also be applied. The specific power level range indicates the practical operational power level range for normal operation of the power amplifier, i.e. the power level range of signals produced by the power amplifier in normal cases. Since it is required to store a limited number of data within a reasonable range, a preferred arrangement of the plurality of power levels within the specific power level range in this embodiment is assigned according to the non-linear characteristics of the power amplifier. Please note that the arrangement of the plurality of power levels within the specific power level range is not limited to this method, and any alternative method can also be applied to assign the plurality of power levels within the specific power level range. For example, it is feasible to bisect the specific power level range into 10 equal parts and calculate coefficients corresponding to the 10 different power levels.

After step 304, the plurality of calculated $|x(n)|^2$ within the specific power level range and the plurality of reciprocals of the corresponding $d_o$ are to be stored in a first look-up table LUT1 for $1/d_0$ of equation (6) in the subsequent step. In step 308, the plurality of calculated $|x(n-1)|^2$ within the specific power level range and the plurality of the corresponding $d_1$ are to be stored in a second look-up table LUT2 for $d_i$ of equation (6) (i=1) in the subsequent step. Furthermore, in step 310, a plurality of results (i.e. $|x(n)d_0|^2$ of equation (8)) obtained by multiplying a square value of each of the plurality of $d_0$ with a square value of the corresponding pre-distorted output x(n) are respectively stored into a third look-up table LUT3. Then, the pre-distortion function can be derived according to the first look-up table LUT1, the second look-up table LUT2 and the third look-up table LUT3.

Figure 5:
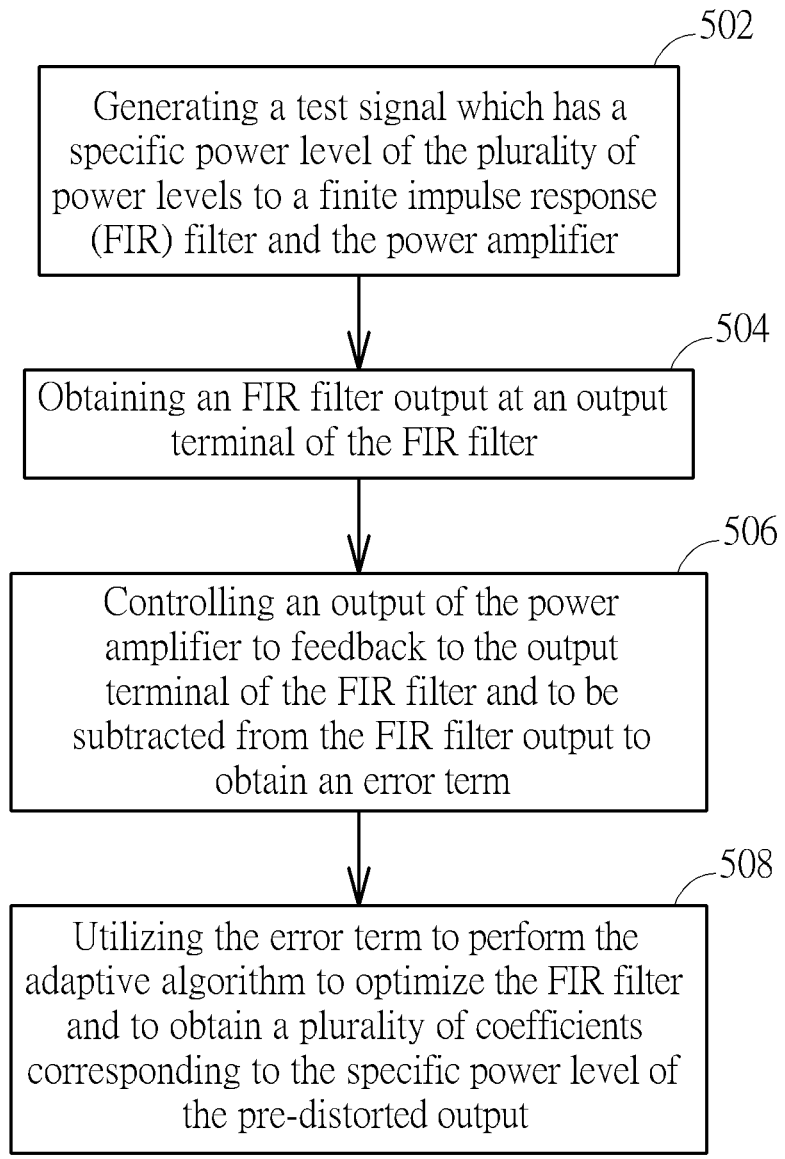
FIG. 5 is a flowchart illustrating a step of deriving a plurality of coefficients by utilizing an adaptive algorithm according to an exemplary embodiment of the present invention.

Details of step 304 are given in the following. FIG. 5 is a flowchart illustrating a step of deriving a plurality of coefficients by utilizing an adaptive algorithm according to an exemplary embodiment of the present invention. Provided that substantially the same result is achieved, the steps in FIG. 5 need not be in the exact order shown and need not be contiguous; that is, other steps can be intermediate. Some steps in FIG. 5 may be omitted according to various embodiments or requirements. Details of the method are described as follows.

Step 502: generating a test signal which has a specific power level of the plurality of power levels to a finite impulse response (FIR) filter and the power amplifier;

Step 504: obtaining an FIR filter output at an output terminal of the FIR filter;

Step 506: controlling an output of the power amplifier to feedback to the output terminal of the FIR filter and to be subtracted from the FIR filter output to obtain an error term; and Step 508: utilizing the error term to perform the adaptive algorithm to optimize the FIR filter and to obtain a plurality of coefficients corresponding to the specific power level of the pre-distorted output.

Figure 6:
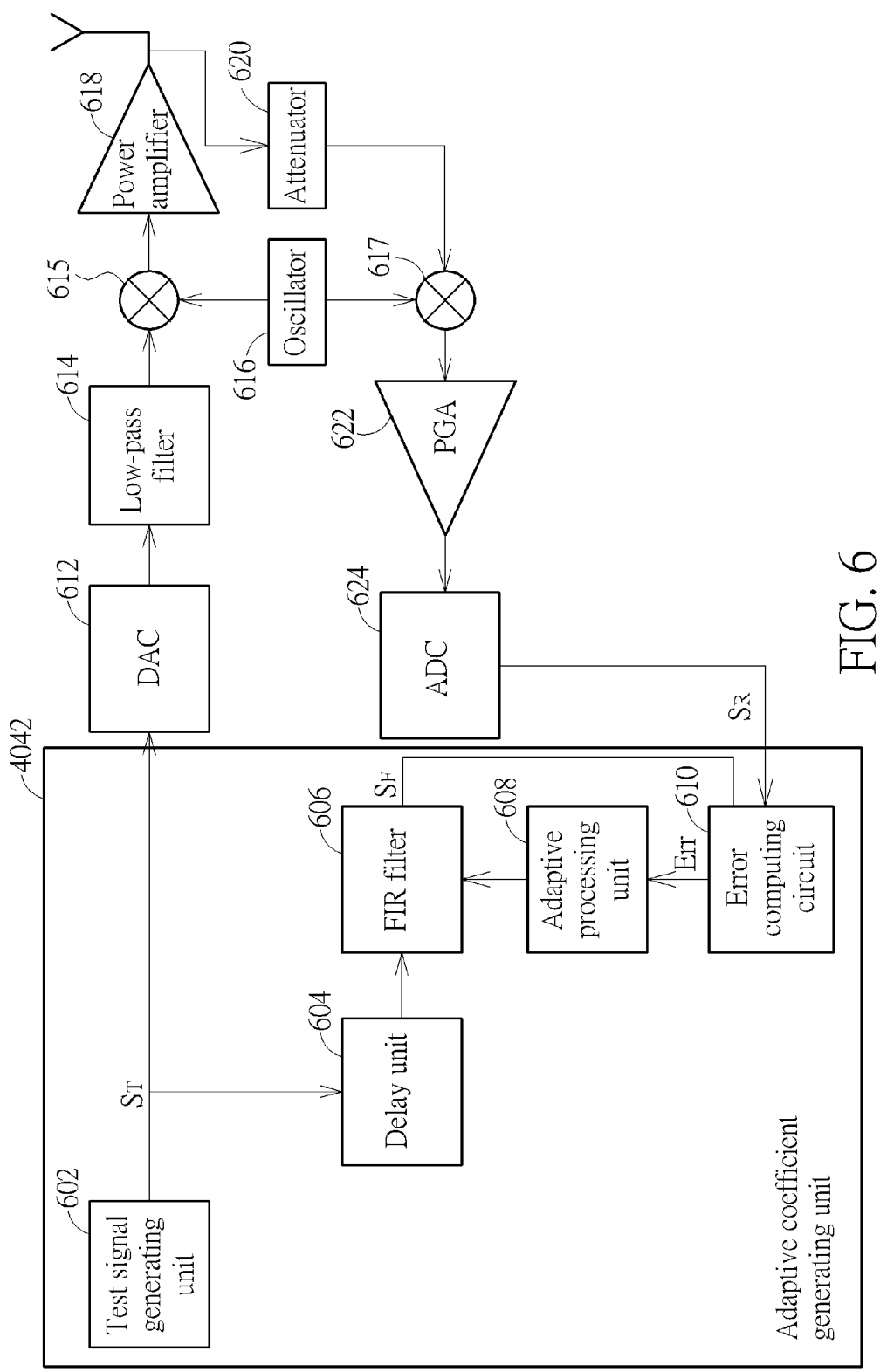
FIG. 6 is a diagram illustrating an adaptive coefficient generating unit of the pre-distortion apparatus according to an exemplary embodiment of the present invention.

FIG. 6 is a diagram illustrating the adaptive coefficient generating unit 4042 of the pre-distortion apparatus 400 according to an exemplary embodiment of the present invention. As shown in FIG. 6, the adaptive coefficient generating unit 4042 includes a test signal generating unit 602, a delay unit 604, an FIR filter 606, an adaptive processing unit 608 and an error computing circuit 610. In addition, FIG. 6 further includes a transmission circuit and a receiving circuit of a communication system to which this embodiment is applied. In FIG. 6, a digital-to-analog converter 612, a low-pass filter 614, an oscillator 616, a power amplifier 618, an attenuator 620, a programmable gain amplifier (PGA) 622, an analog-to-digital converter 624, a mixer 615 and a mixer 617 are illustrated. It should be noted that said transmission circuit and said receiving circuit are for illustrative purposes only, and not limitations of the present invention.

In step 502, the test signal generating unit 602 of the adaptive coefficient generating unit 4042 is utilized to produce the plurality of test signals corresponding to the plurality of power levels mentioned in step 304, wherein the test signal corresponding to each power level is used for the adaptive coefficient generating process. For instance, five different power levels may be selected within the specific power level range, and then the test signal generating unit 602 generates five corresponding test signals according to theses five different power levels, respectively. The adaptive coefficient generating process is performed with respect to one of the five different test signals by the following circuit, and the adaptive coefficient generating process is performed with respect to one of the rest of the test signals, until the adaptive coefficient generating process is completed with respect to all of the five different test signals. Due to a pre-distortion circuit which can compensate the power amplifier 618 in the normal operation mode, the bandwidth of each test signal produced by the test signal generating unit 602 should be close to the actual bandwidth of the data signal processed by the power amplifier 618 in the normal operation mode. In other words, making the characteristics of the test signal close to the characteristics of the real data signal of the power amplifier 618 is essential. Contents of the test signal may be pseudo random, but this is for illustrative purpose and not a limitation of the present invention. Moreover, in this embodiment, a summation of a square value of an in-phase component of the test signal and a square value of a quadrature-phase component of the test signal should be a constant as a result of the specific power level of the test signals being a fixed value.

Figure 7:
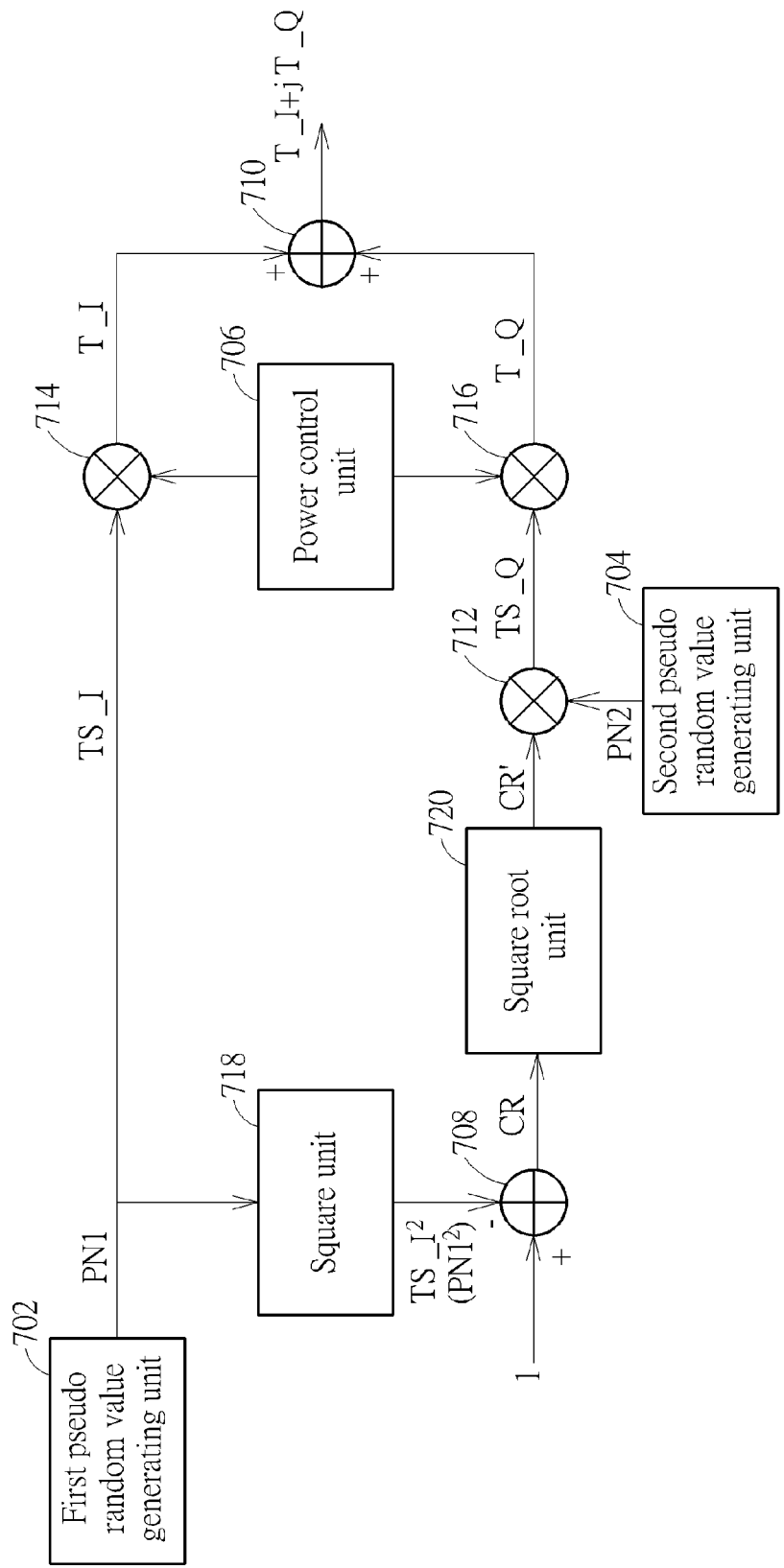
FIG. 7 is a diagram illustrating a test signal generating unit of the adaptive coefficient generating unit of the pre-distortion apparatus according to an exemplary embodiment of the present invention.

With regard to the generation of test signals by the test signal generating unit 602, please refer to FIG. 7, which is a diagram illustrating the test signal generating unit 602 of the adaptive coefficient generating unit 4042 of the pre-distortion apparatus 400 according to an exemplary embodiment of the present invention. The test signal generating unit 602 includes a first pseudo random value generating unit 702, a second pseudo random value generating unit 704, a power control unit 706, a plurality of adders 708, 710, a plurality of multiplier 712, 714, 716, a square unit 718 and a square root unit 720. The first pseudo random value generating unit 702 is utilized to produce random values PN1 within −1 and 1, and outputs as an in-phase test signal component TS_I. The square unit 718 performs a square operation upon the in-phase test signal component TS_I (i.e. PN1) to obtain a square value and the resultant negative value is added by one using the adder 708 to produce a calculation result CR. The square root of the calculation result CR is then derived by the square root unit 720 and outputted as a calculation result CR'. With regard to the second pseudo random value generating unit 706, the second pseudo random value generating unit 706 randomly selects 1 or −1 as a selection result PN2, and the selection result PN2 is outputted and multiplied by the calculation result CR' to generate a quadrature-phase test signal component TS_Q. The power control unit 706 adjusts the in-phase test signal component TS_I and the quadrature-phase test signal component TS_Q according to the specific power level of the test signal currently desired, so as to further produce a power level adjusted in-phase test signal component T_I and a power level adjusted quadrature-phase test signal component T_Q. The power level adjusted in-phase test signal component T_I and the power level adjusted quadrature-phase test signal component T_Q are merged into one signal and outputted as T_I+j*T_Q.

In the following, specific descriptions regarding step 504-508 are given with respect to coefficient generation of one of the plurality of power levels. Please refer to FIG. 6 again. After the test signal generating unit 602 of the adaptive coefficient generating unit 4042 generates a specific power level test signal $S_T$ (e.g. T_I+j*T_Q mentioned above), the specific power level test signal $S_T$ is sent to two different circuit blocks. One of the circuit blocks transforms the specific power level test signal $S_T$ to the analog domain by the digital-to-analog converter 612, and then processed by the low-pass filter 614. Next, the mixer 615 translates the analog signal to a radio frequency by mixing the analog signal at the low-pass filter output with a high-frequency carrier from oscillator 616. The mixed signal is then transmitted to the power amplifier 618, and rather than being sent out by the antenna, the amplified signal is fed back to the attenuator 620 of the receiving circuit directly via an internal loopback path. The received signal is down-converted from the radio frequency via the mixer 617, and after the PGA 622, the signal is converted to the digital domain by the analog-to-digital converter 624, wherein the digitized signal is denoted as a feedback test signal $S_R$. The other of the circuit blocks transmits the specific power level test signal $S_T$ to the FIR filter 606 and produces an FIR filter output $S_F$, and then an error Err between the FIR filter output $S_F$ and the feedback test signal $S_R$ is calculated by the error computing circuit 610.

It should be noted that the feedback test signal $S_R$ and the FIR filter output $S_F$ may be asynchronous as a result of the feedback path delay. The delay unit 604 is therefore added into another path depending on design considerations. For example, in the course of transmitting the specific power level test signal $S_T$ to the FIR filter 606, the delay unit 604 is employed to deliberately delay the transmission for a specific time unit to make the FIR filter output $S_F$ synchronous with the feedback test signal $S_R$. The error Err is transmitted to the adaptive processing unit 608 for adjusting tap coefficients of the FIR filter 606 in accordance with the error Err and the adaptive algorithm adapted by the adaptive processing unit 608 until the error Err is converged to a minimum value which cannot be further reduced. The plurality of coefficients of the pre-distorted output corresponding to the specific power level will be obtained when the tap coefficients of the FIR filter 606 is optimized, wherein the optimized result may differ from different adaptive algorithms.

Figure 8:
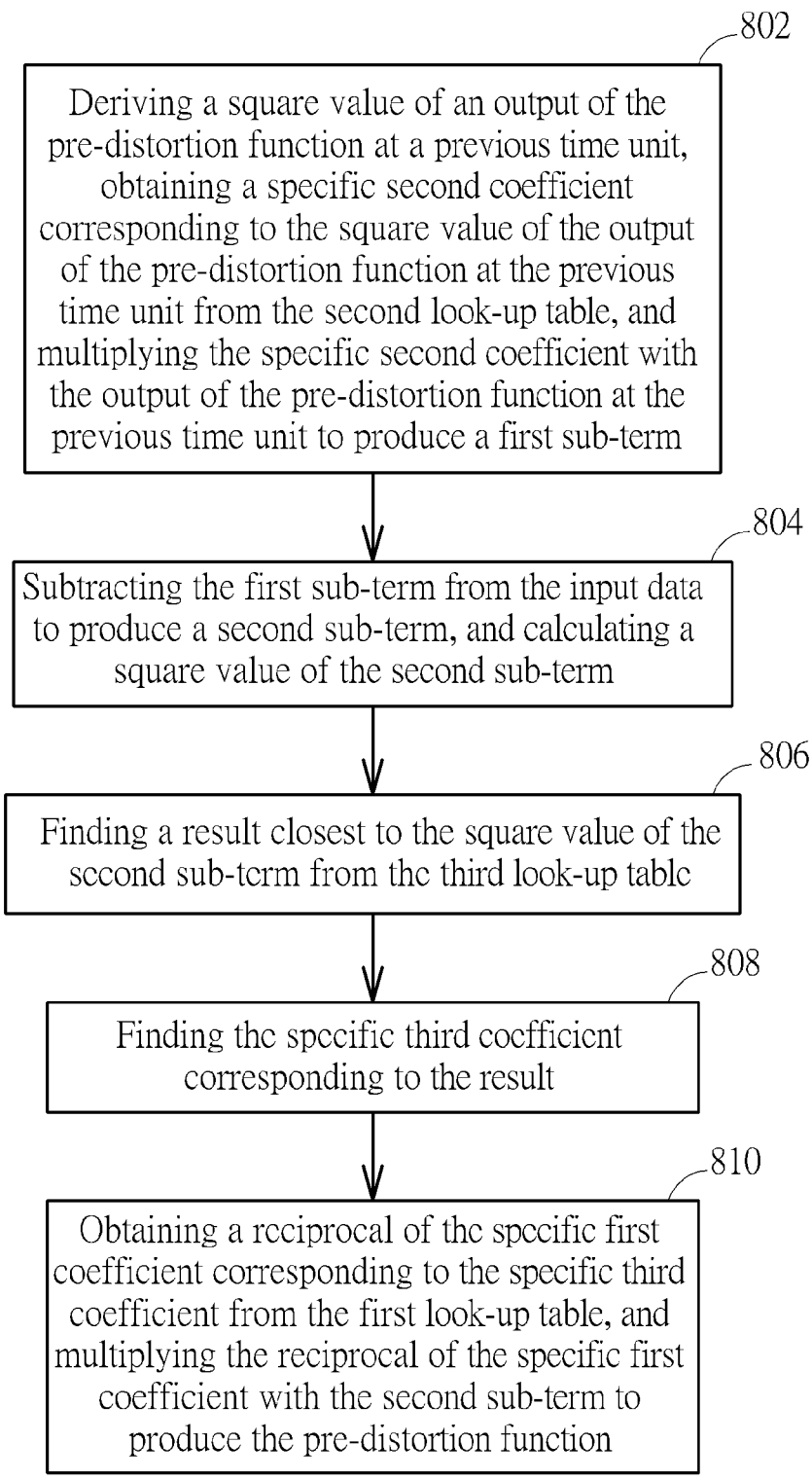
FIG. 8 is a flowchart illustrating a step of deriving a pre-distortion function in accordance with a first look-up table, a second look-up table and a third look-up table according to an exemplary embodiment of the present invention.

Details of step 312 are given in the following. FIG. 8 is a flowchart illustrating a step of deriving a pre-distortion function in accordance with a first look-up table, a second look-up table and a third look-up table according to an exemplary embodiment of the present invention. Provided that substantially the same result is achieved, the steps in FIG. 8 need not be in the exact order shown and need not be contiguous; that is, other steps can be intermediate. Some steps in FIG. 8 may be omitted according to various embodiments or requirements. Details of the method are described as follows.

Step 802: deriving a square value of an output of the pre-distortion function at a previous time unit, obtaining a specific second coefficient corresponding to the square value of the output of the pre-distortion function at the previous time unit from the second look-up table, and multiplying the specific second coefficient with the output of the pre-distortion function at the previous time unit to produce a first sub-term;

Step 804: subtracting the first sub-term from the input data to produce a second sub-term, and calculating a square value of the second sub-term;

Step 806: finding a result closest to the square value of the second sub-term from the third look-up table;

Step 808: finding the specific third coefficient corresponding to the result; and Step 810: obtaining a reciprocal of the specific first coefficient corresponding to the specific third coefficient from the first look-up table, and multiplying the reciprocal of the specific first coefficient with the second sub-term to produce the pre-distortion function.

Figure 9:
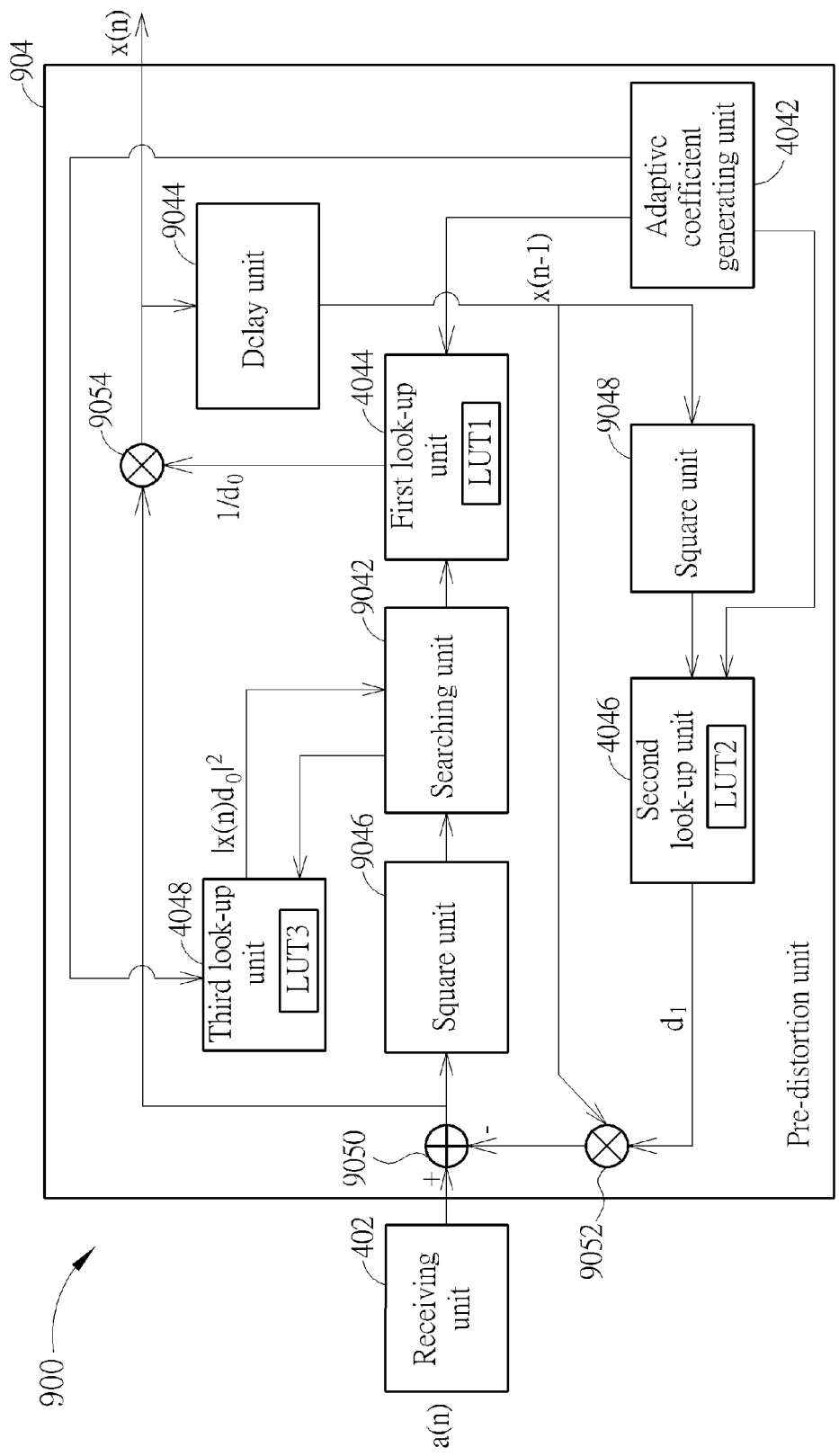
FIG. 9 is a diagram illustrating a pre-distortion apparatus according to another exemplary embodiment of the present invention.

Please refer to FIG. 9 along with FIG. 8. FIG. 9 is a diagram illustrating a pre-distortion apparatus according to another exemplary embodiment of the present invention. The pre-distortion apparatus 900 includes at least one portion (e.g. a portion or all) of an electronic device. More particularly, the pre-distortion apparatus 900 can be a control circuit such as an integrated circuit (IC) within the electronic device. In another example, the pre-distortion apparatus 900 can be the whole of the electronic device mentioned above. Examples of the electronic device may include, but are not limited to, a mobile phone (e.g. a multifunctional mobile phone), a mobile computer (e.g. tablet computer), a personal digital assistant (PDA), and a personal computer such as a laptop computer.

As shown in FIG. 9, the pre-distortion apparatus 900 includes the receiving unit 402 of FIG. 4 and a pre-distortion unit 904. As mentioned above, the receiving unit 402 is used to execute step 302, i.e. receiving an input data a(n), wherein n denotes a discrete time of a digital signal process. In this embodiment, the input data a(n) is an OFDM data produced by an OFDM process, wherein the OFDM process is widely applied in communication systems, especially in wireless communication systems. It should be noted, however, that the present invention is not limited to wireless communication systems. The pre-distortion unit 904 includes the adaptive coefficient generating unit 4042, the first look-up unit 4044, the second look-up unit 4046, and the third look-up unit 4048 of FIG. 4, and further includes a searching unit 9042, a delay unit 9044, a square unit 9046 and a square unit 9048, an adder 9050 and a plurality of multipliers 9052, 9054. Please note that the modules mentioned in this embodiment are general purpose, and the specific implementation of each module will be given in embodiments disclosed in the following paragraphs. For simplifying the complexity of each embodiment, an order of a memory polynomial of a target power amplifier that the pre-distortion unit 904 deals with is two, and a memory depth is one; in other words, for equation (1), (2) and (3), p=2 and M=1. The order of the depth of the memory polynomial of the power amplifier and the size of the memory depth mentioned above is not limited to the above example, however.

In FIG. 9, after the receiving unit 402 transmits the input data a(n) to the pre-distortion unit 904, the input data a(n) goes through a pre-distortion function of the pre-distortion unit 904 so that a pre-distorted output x(n) can be obtained. In this embodiment, the pre-distortion process is the exact content of equation (6). Please refer to the deductions associated with equations (1) to (8) and the descriptions regarding steps 304 to 310 for details regarding building the first look-up unit 4044, the second look-up unit 4046, and the third look-up unit 4048.

After the adaptive process, the plurality of calculated $|x(n)|^2$ within the specific power level range and the plurality of reciprocals of the corresponding $d_o$ are to be stored in the first look-up table LUT1 of the first look-up unit 4044 for calculating the term $1/d_0$ of equation (6); and the plurality of calculated $|x(n-1)|^2$ within the specific power level range and the plurality of the corresponding $d_1$ are to be stored in a second look-up table LUT2 of the second look-up unit 4046 for calculating the term $d_i$ of equation (6) (i=1); and a plurality of $|x(n)d_0|^2$ in equation (8)) obtained by multiplying a square value of each of the plurality of $d_0$ with a square value of the corresponding pre-distorted output x(n) are respectively stored into the third look-up table LUT3 of the third look-up unit 4048. x(n) can then be derived according to equation (6), i.e.

$$x(n) = \frac{1}{d_0}\left[a(n) - \sum_{i=1}^{M} x(n-i)d_i\right],$$

where M=1.

In step 802, the delay unit 9044 is used to delay data for one time unit, and an output of the delay unit 9044 is denoted as x(n−1). The corresponding $d_1$ can be found in the second look-up table unit 4046 by using $|x(n-1)|^2$ (outputted by the square unit 9048). Then a first sub-term can be derived by multiplying x(n−1) and $d_1$, i.e. $x(n-1)d_1$ of equation (6). In step 804, a second sub-term can be derived by subtracting the first sub-term $x(n-1)d_1$ from the input data a(n), i.e. adding the input data a(n) to a negative value of the first sub-term $x(n-1)d_1$. By squaring the second sub-term $a(n)-x(n-1)d_1$, a square value $|a(n)-x(n-1)d_1|^2$ can be obtained by using the square unit 9046. Further, it is given that $$|x(n)d_0|^2 = \left|a(n) - \sum_{i=1}^{M} x(n-i)d_i\right|^2$$

according to equation (8); therefore, the searching unit 9042 is employed to find a result closest to the square value of the second sub-term from the third look-up table unit 4048. From a plurality of sets of $|x(n)d_0|^2$ stored in the third look-up table unit 4048, the one closest to $|a(n)-x(n-1)d_1|^2$ is selected by the searching unit 9042. In step 808, $|x(n)d_0|^2$ obtained in step 806 can be used to find out the corresponding $|x(n)d_0|^2$, and the first look-up table unit 4044 is used to obtain $1/d_0$ corresponding to $|x(n)|^2$ found in step 808. After being multiplied by the second sub-term $|a(n)-x(n-1)d_1|$, the right side of the equal sign of equation (6) can be derived, i.e. $|a(n)-x(n-1)d_1|/d_0$, which is the desired term in this embodiment.

It should be noted that the contents of the first look-up table LUT1, the second look-up table LUT2 and the third look-up table LUT3 may be built automatically after powering on the pre-distortion apparatus 400 and the pre-distortion apparatus 900, or the contents may be updated automatically when the environment of the communication system changes. For example, the contents of the first look-up table LUT1, the second look-up table LUT2 and the third look-up table LUT3 may be built automatically when the channel changes or when the temperature dramatically changes. Please note that this is for illustrative purposes only, and not a limitation of the present invention. In other words, the contents of the first look-up table LUT1, the second look-up table LUT2 and the third look-up table LUT3 may be built automatically whenever a designer considers the needs based on practical application. The circuits related to implementation of equation (6) are for illustrative purposes only. In other words, alternative designs which meet equation (6) may also be applied in the present invention.

Figure 10:
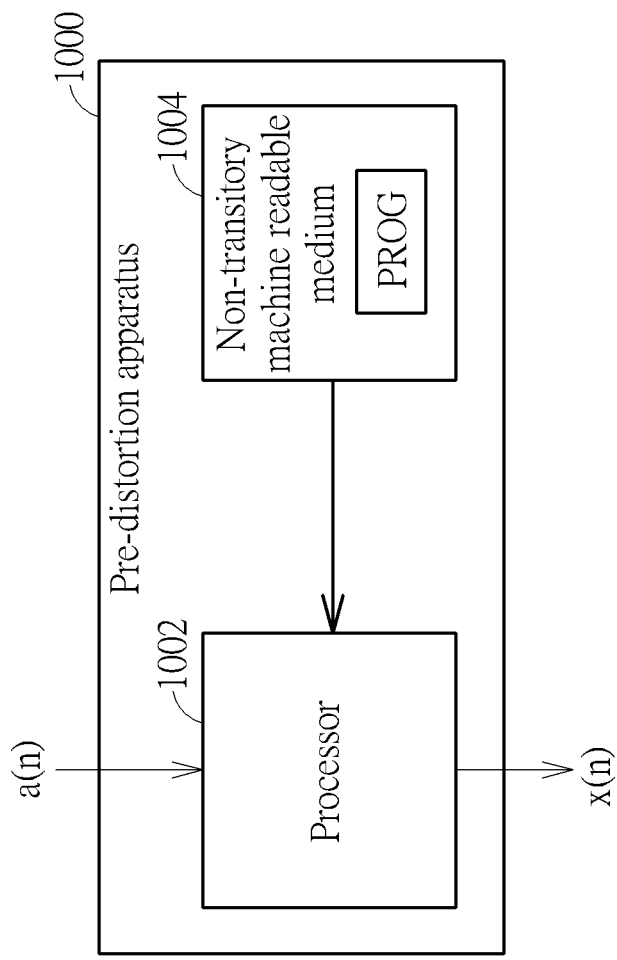
FIG. 10 is a diagram illustrating a computer system for performing the pre-distortion method according to an exemplary embodiment of the present invention.

Please refer to FIG. 10, which is a diagram illustrating a pre-distortion apparatus 1000 for performing the above-mentioned pre-distortion method according to an exemplary embodiment of the present invention. The pre-distortion apparatus 1000 may be a computer system, including a processor 1002 and a non-transitory machine readable medium 1004. For instance, the pre-distortion apparatus 1000 could be a personal computer, and the non-transitory machine readable medium 1004 could be any storage device capable of storing data in a personal computer, e.g. a volatile memory, non-volatile memory, hard disk or CD-ROM. In this embodiment, the non-transitory machine readable medium 1004 stores a program code PROG, wherein when the program code PROG is loaded and executed by the processor 1002, the program code PROG enables the processor to perform the pre-distortion method (i.e. the steps 302~312 shown in FIG. 3, the steps 502~508 shown in FIG. 5, and the steps 802~810 shown in FIG. 8) of the present invention. Those skilled in the art will readily understand the pre-distortion method processed by making the processor 1002 execute the program code PROG after reading the above paragraphs; further description is therefore omitted here for brevity.

One of the advantages of the present invention is that non-linear characteristics and/or memory effect of a power amplifier in an RF circuit can be compensated by applying the above methods and apparatus, so that user experience of an electronic device can be improved over the entire bandwidth.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A pre-distortion method, comprising:
receiving an input data; and
obtaining a pre-distorted output by inputting the input data into a pre-distortion function, wherein the pre-distortion function is determined according to a power amplifier, comprising:
deriving a plurality of coefficients respectively corresponding to a plurality of power levels of the pre-distorted output within a specific power level range by utilizing an adaptive algorithm, wherein the plurality of coefficients includes at least a first coefficient and a second coefficient of a function of the power amplifier.

2. The pre-distortion method of claim 1, wherein the input data is an Orthogonal. Frequency Division Multiplexing (OFDM) data.

3. The pre-distortion method of claim 1, wherein the step of obtaining the pre-distorted output by inputting the input data into the pre-distortion function further comprises:
storing a reciprocal of the first coefficient corresponding to each of the plurality of power levels into a first look-up table;
storing the second coefficient corresponding to each of the plurality of power levels into a second look-up table;
storing a plurality of results obtained by multiplying a square value of each of a plurality of first coefficients with a square value of the corresponding pre-distorted output, respectively, into a third look-up table; and
deriving the pre-distortion function according to the first look-up table, the second look-up table and the third look-up table.

4. The pre-distortion method of claim 1, wherein the adaptive algorithm is a least mean square (LMS) algorithm.

5. The pre-distortion method of claim 1, wherein the plurality of power , levels within the specific power level range is assigned according to a non-linear characteristic of the power amplifier.

6. The pre-distortion method of claim 1, wherein the step of deriving the plurality of coefficients corresponding to each of the plurality of power levels of the pre-distorted output within the specific power level range by utilizing the adaptive algorithm comprises:
generating a test signal which has a specific power level of the plurality of power levels to a finite impulse response (FIR) filter and the power amplifier;
obtaining an FIR filter output at an output terminal of the FIR filter;
controlling an output of the power amplifier to be fed back to the output terminal of the FIR filter and to be subtracted from the FIR filter output to obtain an error term; and
utilizing the error term to perform the adaptive algorithm to optimize the FIR filter and to obtain a plurality of coefficients corresponding to the specific power level of the pre-distorted output.

7. The pre-distortion method of claim 6, wherein contents of the test signal are pseudo random values.

8. The pre-distortion method of claim 6, wherein the test signal possesses a bandwidth where the power amplifier desires to process.

9. The pre-distortion method of claim 3, wherein the step of deriving the pre-distortion function according to the first look-up table, the second look-up table and the third look-up table comprises:
deriving a square value of an output of the pre-distortion function at a previous time unit, and obtaining a specific second coefficient corresponding to the square value of the output of the pre-distortion function at the previous time unit from the second look-up table, and multiplying the specific second coefficient with the output of the pre-distortion function at the previous time unit to produce a first sub-term;
subtracting the first sub-term from the input data to produce a second sub-term, and obtaining a specific third coefficient corresponding to a square value of the second sub-term from the third look-up table; and
obtaining a reciprocal of the specific first coefficient corresponding to the specific third coefficient from the first look-up table, and multiplying the reciprocal of a specific first coefficient with the second sub-term to produce the pre-distortion function.

10. The pre-distortion method of claim 9, wherein the step of obtaining the specific third coefficient corresponding to the square value of the second sub-term from the third look-up table comprises:
finding a result closest to the square value of the second sub-term from the third look-up table; and
finding the specific third coefficient corresponding to the result.

11. A pre-distortion apparatus, comprising:
a receiving unit, arranged for receiving an input data; and
a pre-distortion unit, arranged for obtaining a pre-distorted output by inputting the input data into a pre-distortion function, wherein the pre-distortion function is determined according to a following power amplifier, comprises:
an adaptive coefficient generating unit, arranged for deriving a plurality of coefficients respectively corresponding to a plurality of power levels of the pre-distorted output within a specific power level range by utilizing an adaptive algorithm, wherein the plurality of coefficients includes at least a first coefficient and a second coefficient of a function of the power amplifier.

12. The pre-distortion apparatus of claim 11, wherein the input data is an Orthogonal Frequency Division Multiplexing (OFDM) data.

13. The pre-distortion apparatus of claim 11, wherein the pre-distortion unit further comprises:
a first look-up unit, possessing a first look-up table, wherein the first look-up table stores a reciprocal of the first coefficient corresponding to each of the plurality of power levels into a first look-up table;
a second look-up unit, possessing a second look-up table, wherein the second look-up table stores the second coefficient corresponding to each of the plurality of power levels into a second look-up table;
a third look-up unit, possessing a third look-up table, wherein the third look-up table stores a plurality of results obtained by multiplying a square value of each of a plurality of first coefficients with a square value of the corresponding pre-distorted output respectively into a third look-up table; and
an arithmetic unit, arranged for deriving the pre-distortion function according to the first look-up table, the second look-up table and the third look-up table.

14. The pre-distortion apparatus of claim 11, wherein the adaptive algorithm is a least mean square (LMS) algorithm.

15. The pre-distortion apparatus of claim 11, wherein the plurality of power levels within the specific power level range is assigned according to a non-linear characteristic of the power amplifier.

16. The pre-distortion apparatus of claim 11, wherein the adaptive coefficient generating unit comprises:
   a test signal generating unit, arranged for generating a test signal which has a specific power level of the plurality of power levels to a finite impulse response (FIR) filter and the power amplifier;
   the FIR filter, arranged for receiving the test signal and outputting an FIR filter output;
   an error computing circuit, arranged for controlling an output of the power amplifier to be fed back to the output terminal of the FIR filter and to be subtracted from the FIR filter output to obtain an error term; and
   an adaptive processing unit, arranged for performing the adaptive algorithm by utilizing the error term to optimize the FIR filter and to obtain a plurality of coefficients corresponding to the specific power level of the pre-distorted output.

17. The pre-distortion apparatus of claim 16, wherein contents of the test signal are pseudo random values.

18. The pre-distortion apparatus of claim 16, wherein the test signal possesses a bandwidth where the power amplifier desires to process.

19. The pre-distortion apparatus of claim 13, wherein the arithmetic unit comprises:
   a first sub-arithmetic unit, arranged for deriving a square value of an output of the pre-distortion function at a previous time unit, obtaining a specific second coefficient corresponding to the square value of the output of the pre-distortion function at the previous time unit from the second look-up table, and multiplying the specific second coefficient with the output of the pre-distortion function at the previous time unit to produce a first sub-term;
   a second sub-arithmetic unit, arranged for subtracting the first sub-term from the input data to produce a second sub-term, and obtaining a specific third coefficient corresponding to a square value of the second sub-term from the third look-up table; and
   a third sub-arithmetic unit, arranged for obtaining a reciprocal of a specific first coefficient corresponding to the specific third coefficient from the first look-up table, and multiplying the reciprocal of the specific first coefficient with the second sub-term to produce the pre-distortion function.

20. The pre-distortion apparatus of claim 19, wherein the second sub-arithmetic unit comprises:
   a searching unit, arranged for finding a result closest to the square value of the second sub-term from the third look-up table; and
   an output unit, arranged for outputting the specific third coefficient corresponding to the result.

21. A non-transitory machine readable medium storing a program code, wherein when executed by a processor, the program code enables the processor to perform a pre-distortion method, the method comprising:
   receiving an input data; and
   obtaining a pre-distorted output by inputting the input data into a pre-distortion function, wherein the pre-distortion function is determined according to a following power amplifier, comprising:
      deriving a plurality of coefficients respectively corresponding to a plurality of power levels of the pre-distorted output within a specific power level range by utilizing an adaptive algorithm, wherein the plurality of coefficients includes at least a first coefficient and a second coefficient of a function of the power amplifier.

22. The non-transitory machine readable medium of claim 21, wherein the input data is an Orthogonal Frequency Division Multiplexing (OFDM) data.

23. The non-transitory machine readable medium of claim 21, wherein the step of obtaining the pre-distorted output by inputting the input data into the pre-distortion function further comprises:
   storing a reciprocal of the first coefficient corresponding to each of the plurality of power levels into a first look-up table;
   storing the second coefficient corresponding to each of the plurality of power levels into a second look-up table;
   storing a plurality of results obtained by multiplying a square value of each of a plurality of first coefficients with a square value of the corresponding pre-distorted output respectively into a third look-up table; and
   deriving the pre-distortion function according to the first look-up table, the second look-up table and the third look-up table.

24. The non-transitory machine readable medium of claim 21, wherein the adaptive algorithm is a least mean square (LMS) algorithm.

25. The non-transitory machine readable medium of claim 21, wherein the plurality of power levels within the specific power level range is assigned according to a non-linear characteristic of the power amplifier.

26. The non-transitory machine readable medium of claim 21, wherein the step of deriving the plurality of coefficients of the pre-distorted output corresponding to each of the plurality of power levels within the specific power level range by utilizing the adaptive algorithm comprises:
   generating a test signal which has a specific power level of the plurality of power levels to a finite impulse response (FIR) filter and the power amplifier;
   obtaining an FIR filter output at an output terminal of the FIR filter;
   controlling an output of the power amplifier to be fed back to the output terminal of the FIR filter and to be subtracted from the FIR filter output to obtain an error term; and
   utilizing the error term to perform the adaptive algorithm to optimize the FIR filter and to obtain a plurality of coefficients corresponding to the specific power level of the pre-distorted output.

27. The non-transitory machine readable medium of claim 26, wherein contents of the test signal are pseudo random values.

28. The non-transitory machine readable medium of claim 26, wherein the test signal possesses a bandwidth where the power amplifier desires to process.

29. The non-transitory machine readable medium of claim 23, wherein the step of deriving the pre-distortion function according to the first look-up table, the second look-up table and the third look-up table comprises:
   deriving a square value of an output of the pre-distortion function at a previous time unit, obtaining a specific second coefficient corresponding to the square value of the output of the pre-distortion function at the previous time unit from the second look-up table, and multiplying the specific second coefficient with the output of the pre-distortion function at the previous time unit to produce a first sub-term;

subtracting the first sub-term from the input data to produce a second sub-term, and obtaining a specific third coefficient corresponding to a square value of the second sub-term from the third look-up table; and obtaining a reciprocal of a specific first coefficient corresponding to the specific third coefficient from the first look-up table, and multiplying the reciprocal of the specific first coefficient with the second sub-term to produce the pre-distortion function.

30. The non-transitory machine readable medium of claim 29, wherein the step of obtaining the specific third coefficient corresponding to the square value of the second sub-term from the third look-up table comprises:

finding a result closest to the square value of the second sub-term from the third look-up table; and finding the specific third coefficient corresponding to the result.

* * * * *